(12) United States Patent
Nelson et al.

(10) Patent No.: US 8,623,757 B2
(45) Date of Patent: *Jan. 7, 2014

(54) PRODUCING A VERTICAL TRANSISTOR INCLUDING REENTRANT PROFILE

(75) Inventors: Shelby F. Nelson, Pittsford, NY (US); David H. Levy, Rochester, NY (US); Lee W. Tutt, Webster, NY (US)

(73) Assignee: Eastmak Kodak Company, Rochester, NY (US)

( * ) Notice: Subject to any disclaimer, the term of this patent is extended or adjusted under 35 U.S.C. 154(b) by 15 days.

This patent is subject to a terminal disclaimer.

(21) Appl. No.: 13/248,560

(22) Filed: Sep. 29, 2011

(65) Prior Publication Data
US 2013/0084681 A1    Apr. 4, 2013

(51) Int. Cl.
    *H01L 21/336* (2006.01)
(52) U.S. Cl.
    USPC .................. 438/627; 257/E21.41
(58) Field of Classification Search
    USPC .................................. 438/156
    See application file for complete search history.

(56) References Cited

U.S. PATENT DOCUMENTS

| | | | |
|---|---|---|---|
| 6,197,641 B1 * | 3/2001 | Hergenrother et al. | 438/268 |
| 7,238,610 B2 * | 7/2007 | Barns | 438/641 |
| 7,413,982 B2 | 8/2008 | Levy | |
| 7,456,429 B2 | 11/2008 | Levy | |
| 7,998,878 B2 | 8/2011 | Levy et al. | |
| 8,017,183 B2 | 9/2011 | Yang et al. | |
| 8,273,654 B1 * | 9/2012 | Nelson et al. | 438/627 |
| 2006/0213957 A1 | 9/2006 | Addington et al. | |
| 2007/0093045 A1 | 4/2007 | Yamaguchi et al. | |
| 2008/0166884 A1 | 7/2008 | Nelson et al. | |
| 2009/0081827 A1 | 3/2009 | Yang et al. | |
| 2009/0130858 A1 | 5/2009 | Levy | |
| 2011/0204509 A1 * | 8/2011 | Lin et al. | 257/692 |

FOREIGN PATENT DOCUMENTS

JP    2-140863    11/1990

* cited by examiner

*Primary Examiner* — Telly Green
*Assistant Examiner* — Damian A Hillman
(74) *Attorney, Agent, or Firm* — William R. Zimmerli

(57) ABSTRACT

Producing a vertical transistor includes providing a substrate including a gate material layer stack with a reentrant profile. A patterned deposition inhibiting material is deposited over a portion of the gate material layer stack and over a portion of the substrate. An electrically insulating material layer is deposited over a portion of the gate material layer stack and over a portion of the substrate using a selective area deposition process in which the electrically insulating material layer is not deposited over the patterned deposition inhibiting material. A semiconductor material layer is deposited over the electrically insulating material layer.

4 Claims, 6 Drawing Sheets

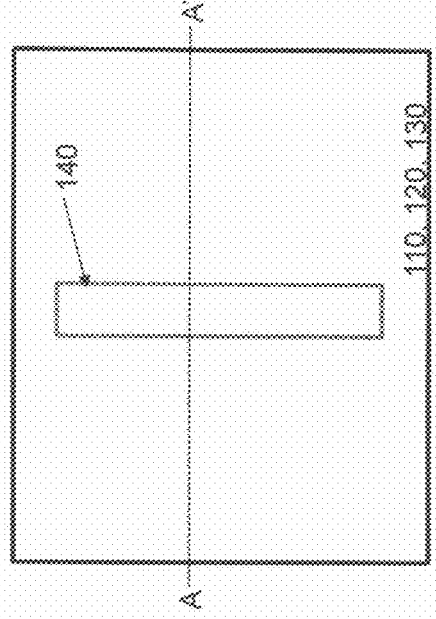
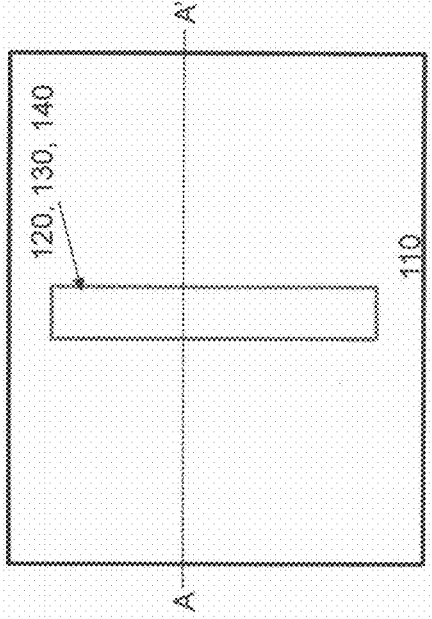
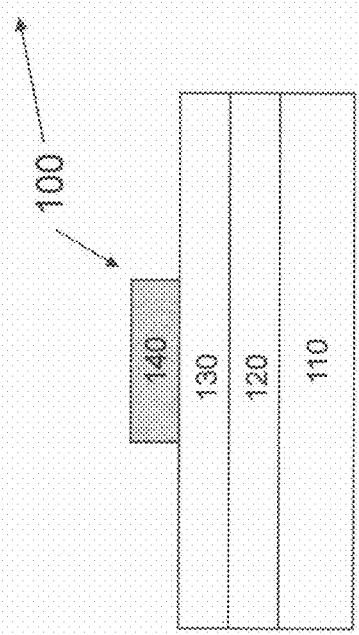
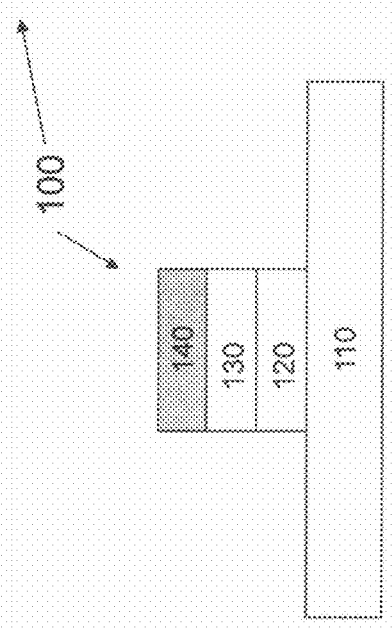
Figure 2a
Figure 2b
Figure 3a
Figure 3b

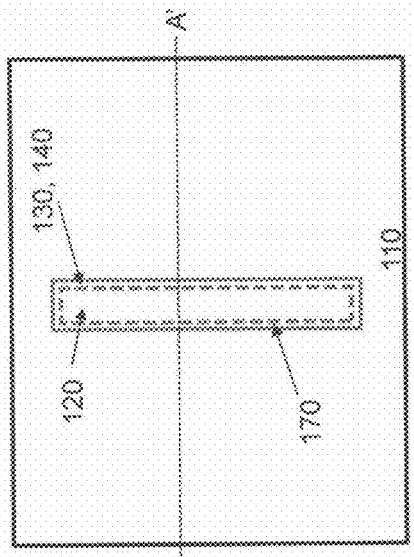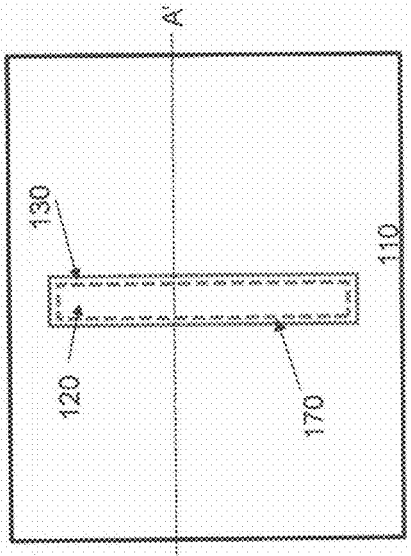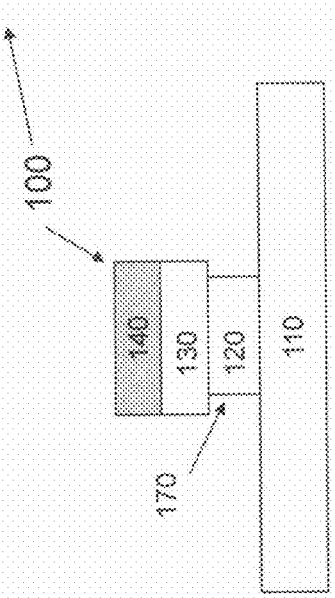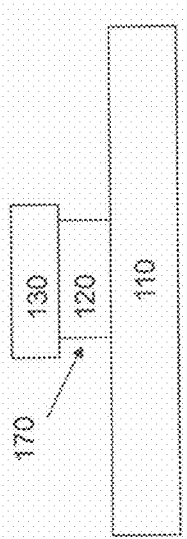

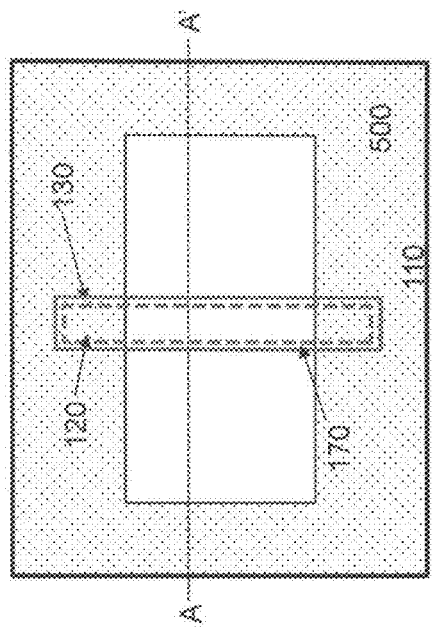
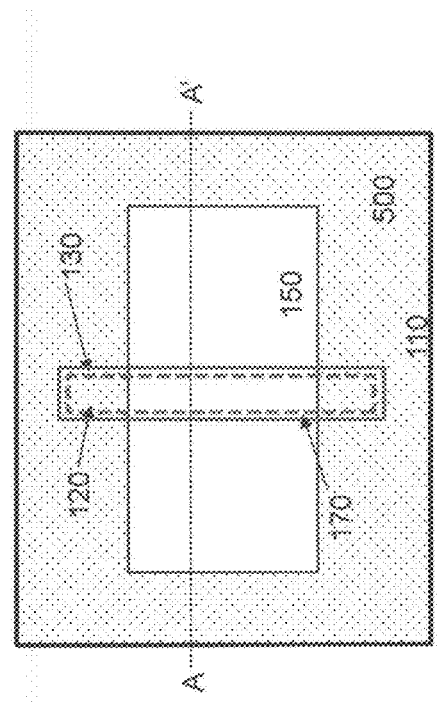
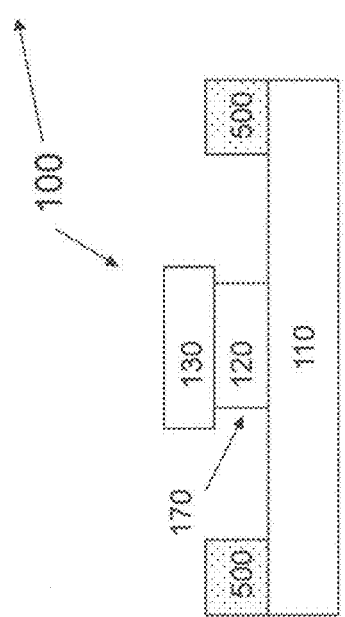
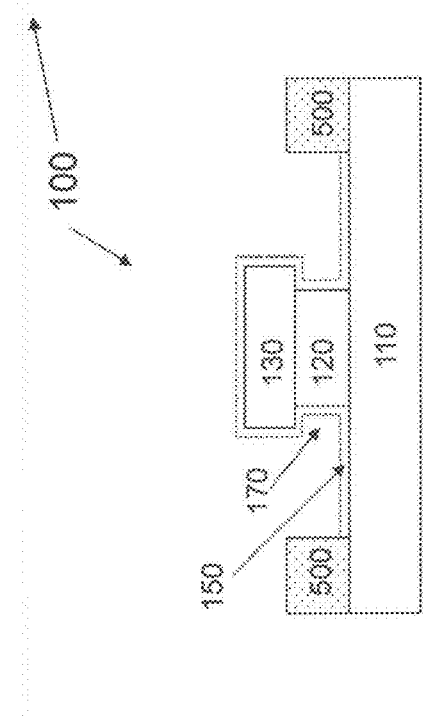
Figure 6a
Figure 6b
Figure 7a
Figure 7b

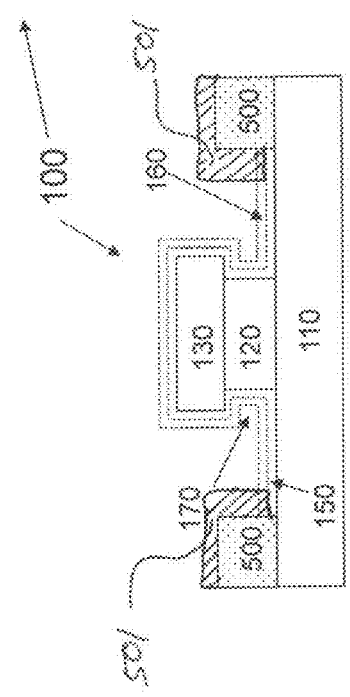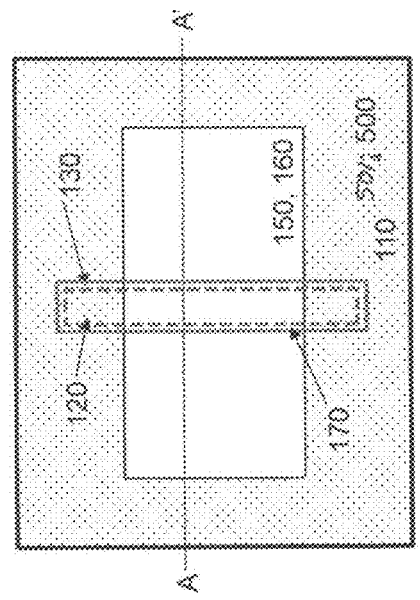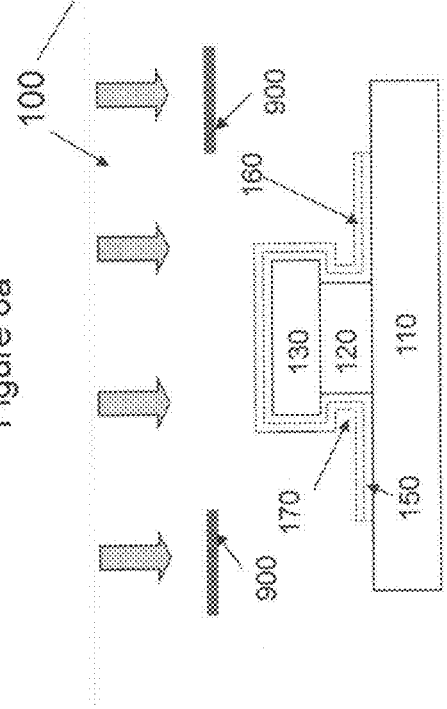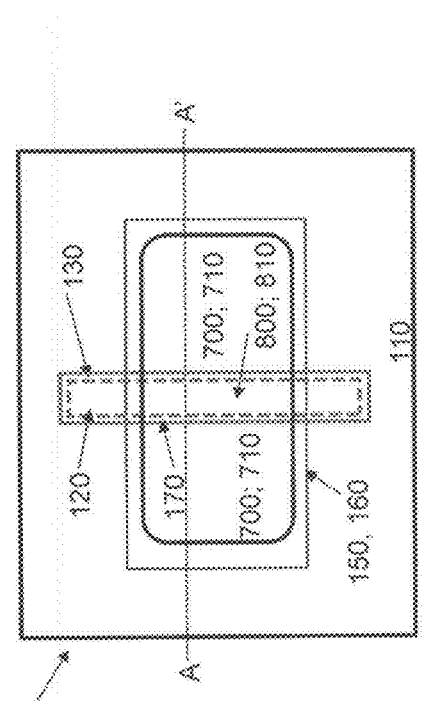

PRODUCING A VERTICAL TRANSISTOR INCLUDING REENTRANT PROFILE

CROSS REFERENCE TO RELATED APPLICATIONS

Reference is made to commonly-assigned, U.S. Pat. No. 8,273,654, entitled "PRODUCING A VERTICAL TRANSISTOR INCLUDING REENTRANT PROFILE", filed concurrently herewith.

FIELD OF THE INVENTION

This invention relates generally to semiconductor devices, and in particular to vertical thin film transistor (VTFT) devices. Further, this invention relates to a method of atomic layer deposition of materials onto a substrate and the use of polymers as deposition inhibitor materials in selective deposition. This invention also relates to electronic devices prepared using this method.

BACKGROUND OF THE INVENTION

In semiconductor processing technology, planar substrate surfaces which are horizontal with respect to a wafer surface are patterned by photolithographic methods in combination with selective etching processes. During the processing of integrated circuits, reliefs with a pronounced topography are formed on the wafer or substrate surface. Typically, this type of relief includes surfaces which are inclined or vertical with respect to the substrate surface. As sizes of integrated circuits continue to shrink, it is becoming more and more necessary to pattern vertical or inclined device surfaces so as to functionally differentiate these devices over their vertical extent while still maintaining pattern alignment. Examples of these types of semiconductor devices include deep trench capacitors, stacked capacitors, and vertical transistors.

Currently, it is not possible to put patterns directly on walls which are vertical with respect to the substrate surface using conventional photolithographic techniques. Usually, vertical wall patterning of this nature is accomplished using a suitable filler material which, when partially filling in a trench, acts as a mask for the portions of the wall located underneath while allowing for processing of the walls above the filler material. For example, when an oxide is to be deposited exclusively on vertical walls below a filler material, the oxide is first deposited or produced over the entire surface of the relief. The relief or trench is initially completely filled with a suitable filler material. Then, the filler material is recessed back to a depth that just covers the desired oxide. After uncovered sections of the oxide are removed, the remaining filler material is removed.

Alternatively, when an oxide is to be deposited or produced only in upper regions of a vertical wall, an etching stop layer, for example, a nitride layer is first provided over the entire surface of the entire relief pattern. A different material, susceptible to directional etching, for example, polycrystalline silicon, is used to fill the relief, and is etched back as far as the desired coverage depth of the final vertical oxide. After the etching stop layer is removed from the unfilled sections of the walls, an oxide is deposited or generated using a thermal technique in the uncovered regions. Next, the oxide is anisotropically etched which removes the deposited oxide from horizontal. This is followed by removal of the filler material and, then, the removal of the etching stop layer.

There are deposition processes which can be used to deposit thin films on vertical or inclined surfaces of a substrate relief. However, it is difficult to control the thickness of the layer deposited. Typically, the thickness of the coating decreases as the depth of the relief increases, for example, as the length of the vertical or inclined wall increases. As such, layers deposited using these types of deposition processes have considerable differences in thickness over the length of the relief. These types of deposition processes include plasma-enhanced chemical vapor deposition (PECVD) and diffusion-limited deposition of silicon oxide using tetraethyl orthosilicate (TEOS).

Modern-day electronics systems require multiple patterned layers of electrically or optically active materials, sometimes over a relatively large substrate. Electronics such as radio frequency identification (RFID) tags, photovoltaics, and optical and chemical sensors all require some level of patterning in their electronic circuitry. Flat panel displays, such as liquid crystal displays or electroluminescent displays rely upon accurately patterned sequential layers to form thin film components of the backplane. These electronic components include capacitors, transistors, and power buses. The combination of photolithographic patterning methods and selective etch processes is commonly referred to as subtractive patterning. Subtractive patterning has several shortcomings including high cost, incompatibility with large substrates, and complexity of selective etch processes.

As such, there is an ongoing need to provide semiconductor device components that include patterned vertical or inclined device surfaces. There is also an ongoing need to provide manufacturing techniques capable of processing small device features of semiconductor devices without requiring high resolution alignment tolerances. Further, the industry is continually looking for new methods of materials deposition and layer patterning for improved performance and the ability to produce large low cost electronics systems containing these semiconductor components.

SUMMARY OF THE INVENTION

According to an aspect of the present invention, producing a vertical transistor includes providing a substrate including a gate material layer stack with a reentrant profile. A patterned deposition inhibiting material is deposited over a portion of the gate material layer stack and over a portion of the substrate. An electrically insulating material layer is deposited over a portion of the gate material layer stack and over a portion of the substrate using a selective area deposition process in which the electrically insulating material layer is not deposited over the patterned deposition inhibiting material. A semiconductor material layer is deposited over the electrically insulating material layer.

According to another aspect of the invention, depositing the semiconductor material layer over the electrically insulating material layer can include depositing the semiconductor material layer over the electrically insulating material layer using a selective area deposition process in which the semiconductor material layer is not deposited over the patterned deposition inhibiting material.

According to another aspect of the invention, a source/drain material layer is deposited over discrete locations of the semiconductor material layer.

BRIEF DESCRIPTION OF THE DRAWINGS

In the detailed description of the preferred embodiments of the invention presented below, reference is made to the accompanying drawings, in which:

FIGS. 2a through 10b are schematic cross sectional views and planar top views of process steps associated with an example embodiment of a method of manufacturing the vertical transistor shown in FIGS. 1a and 1b.

DETAILED DESCRIPTION OF THE INVENTION

The present description will be directed in particular to elements forming part of, or cooperating more directly with, apparatus in accordance with the present invention. It is to be understood that elements not specifically shown or described may take various forms well known to those skilled in the art.

Figure 1B:
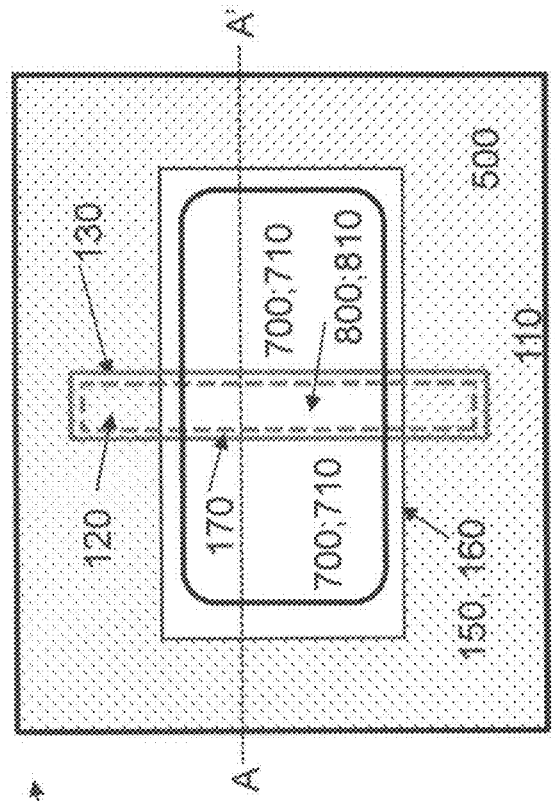
FIGS. 1a and 1b are a schematic cross sectional view and a planar top view, respectively, of a vertical transistor.
Figure 1A:
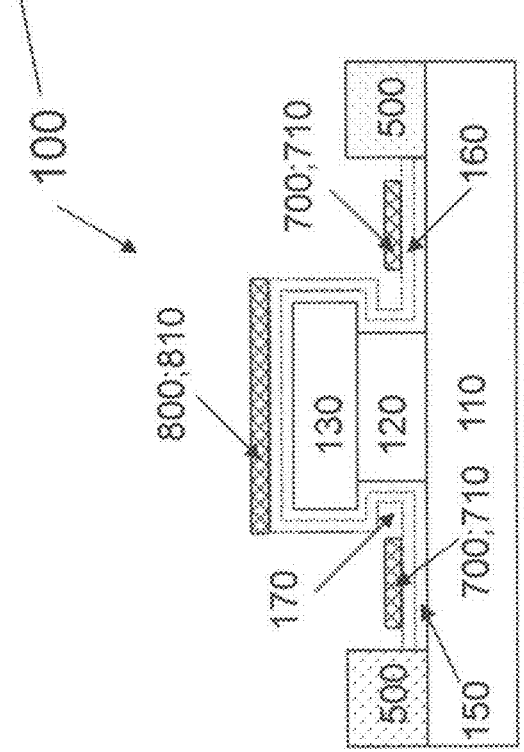

Referring to FIGS. 1a and 1b, a schematic cross sectional view and a planar top view of a vertical transistor 100 is shown respectively. The schematic cross sectional view in FIG. 1a is taken along line A-A' in FIG. 1b.

Transistor 100 includes a substrate 110 and a conductive material layer stack. In the example embodiment shown in FIGS. 1a and 1b, the conductive material layer stack includes an (a first) electrically conductive material layer 120 and another (a second) electrically conductive material layer 130. Transistor 100 also includes an (a first) electrically insulating material layer 150, a semiconductor material layer 160, an electrode(s) 700, and an electrode 800.

Conductive layer 120 is positioned between substrate 110 and conductive layer 130. A first surface of conductive layer 120 contacts a first surface of substrate 110 while a second surface of conductive layer 120 contacts a first surface of conductive layer 130. Substrate 110, often referred to as a support, can be rigid or flexible.

Conductive layer 130, conductive layer 120, substrate 100, or combinations thereof is appropriately dimensioned (or sized), positioned, or dimensioned and positioned relative to at least one other layer or substrate to create a reentrant profile 170 in transistor 100. As such, it can be said that at least a portion of one or more of conductive layer 130, conductive layer 120, substrate 100 defines the reentrant profile 170 of transistor 100. The reentrant profile 170 shields at least some of conductive layer 120 from material deposited (or coated) using a directional (or line of sight) deposition (or coating) process. The reentrant profile 170 allows at least some of the conductive layer 120 to be accessible to material deposited using a conformal deposition (or coating) process. For example, electrically conductive material layer 130 and electrically conductive material layer 120 can define the reentrant profile 170.

As shown in FIGS. 1a and 1b, the reentrant profile 170 is defined by portions of one or both of electrically conductive material layer 130 and electrically conductive material layer 120. Conducting layer 130 is sized and positioned to extend beyond conductive layer 120 such that conducting layer 130 creates a reentrant profile 170 relative to conductive layer 120. Alternatively stated, conductive layer 120 is sized and positioned to end (in both the left and right directions as shown in FIGS. 1a and 1b) before conductive layer 130 ends such that conductive layer 120 creates a reentrant profile 170 relative to conductive layer 130.

Insulating material layer 150 conforms to the reentrant profile 170 of transistor 100. Insulating material layer 150 is often referred to as a dielectric material layer. Insulating material layer 150 includes first and second surfaces with the first surface being in contact with portions of surfaces of conductive layer 130, conductive layer 120, and substrate 110. The insulating material layer 150 is deposited only in regions that are not covered by deposition inhibition layer 500. Although shown in FIGS. 1a and 1b, the deposition inhibitor layer 500 is removed during manufacture of the transistor 100 and is not present in the final structure of the transistor 100. Semiconductor material layer 160 conforms to the reentrant profile 170 of transistor 100. Semiconductor layer 160 includes first and second surfaces with the first surface being in contact with the second surface of insulating layer 150. The semiconductor material layer 160 is deposited only in regions that are not covered by deposition inhibition layer 500. Alternatively, only one of either the insulating material layer 150 or the semiconductor material layer 160, is deposited and patterned in an additive patterning method, without the use of deposition inhibiting layer 500. Alternatively, a second deposition inhibiting layer 501 (shown in FIGS. 8a and 8b), that is different than deposition inhibiting layer 500, can be used to prevent the deposition of semiconductor material layer 160.

Distinct (or separate, different) portions of the second surface of semiconductor layer 160 are in contact with electrode(s) 700 and electrode 800. Electrode(s) 700 includes another (a third) electrically conductive material layer 710. Electrode 800 includes yet another (a fourth) electrically conductive material layer 810. Electrode(s) 700 and electrode 800 are positioned spaced apart from each other at different locations of transistor 100. The third and the fourth electrically conductive material layers 710, 810 can be the same material layer deposited in the same process step. When this is done, electrode(s) 700 and electrode 800 are included in distinct portions of the same electrically conductive material layer, either material layer 710 or material layer 810. Alternatively, the third and the fourth electrically conductive material layers 710, 810 can be distinct (different) material layers.

Conductive layers 120 and 130 function as the gate of transistor 100. In some example embodiments of transistor 100, electrode(s) 700 functions as the drain of transistor 100 and electrode 800 functions as the source of transistor 100. In other example embodiments of transistor 100, electrode(s) 700 functions as the source and electrode 800 functions as the drain.

The semiconductor device is actuated in the following manner. After transistor 100 is provided, a voltage is applied between the third electrically conductive material layer 710 and the fourth electrically conductive material layer 810. A voltage is also applied to the first electrically conductive material layer 120 or to the second electrically conductive material layer to electrically connect the third electrically conductive material layer 710 and the fourth electrically conductive material layer 810.

The reentrant profile 170 of transistor 100 allows a dimension of the semiconductor material channel of the transistor to be associated with the combined thicknesses of the conductive layers 120 and 130, which function as the gate, of transistor 100. Advantageously, this architecture of the present invention reduces reliance on high resolution or very fine alignment features during the manufacture of transistors that include small channels, and enables improved performance and the ability to produce large low cost electronics systems containing these semiconductor components.

Referring to FIGS. 2a through 10b, schematic cross sectional views and planar top views of process steps associated with an example embodiment of a method of manufacturing transistor 100 are shown.

Generally described, transistor 100 is fabricated in the following manner. A substrate 110 is provided including in order a first electrically conductive material layer 120 and a second electrically conductive material layer 130. A resist material layer 140 is coated or deposited over second electrically conductive material layer 130. Resist material layer 140 is patterned to expose a portion of second electrically conductive material layer 130, shown in FIGS. 2a and 2b. The exposed portion of second electrically conductive material layer 130 is removed to expose a portion of first electrically conductive material layer 120. The exposed portion of first electrically conductive material layer 120 is removed, shown in FIGS. 3a and 3b. Removal of conductive material layer 120 continues to create a reentrant profile 170. As shown in FIGS. 4a and 4b, the reentrant profile 170 is created by the removal of some of first electrically conductive material layer 120 while some of second electrically conductive material layer 130 remains. In this sense, it can be said that the reentrant profile 170 is created in conductive material layer 120 relative to electrically conductive material layer 130.

After removal of photoresist layer 140 (shown in FIGS. 5a and 5b), if such is necessary, a first deposition inhibitor layer 500 is printed on the substrate 110 in regions where the subsequent layer or layers are not desired, shown in FIGS. 6a and 6b. After printing of the first deposition inhibitor layer 500, the remaining exposed material layers 120, 130 and substrate 110 are conformally coated with an electrically insulating material layer 150. Electrically insulating material layer 150 is coated, typically using a conformal coating process, only in regions that are not covered by deposition inhibitor layer 500, shown in FIGS. 7a and 7b. Electrically insulating material layer 150 is conformally coated with a semiconductor material layer 160. Semiconductor material layer 160 is coated, typically using a conformal coating process, only in regions that are not covered by deposition inhibitor layer 500. Alternatively, after conformally depositing electrically insulating material layer 150, deposition inhibitor layer 500 is removed, and a second deposition inhibitor layer 501 is printed. Semiconductor material layer 160 is conformally coated only in regions that are not covered by deposition inhibitor layer 501, shown in FIGS. 8a and 8b.

Alternatively, after removal of photoresist layer 140, if such is necessary, at least one of the electrically insulating material layer 150 or semiconductor material layer 160 can be conformally coated over the remaining exposed material layers 120, 130 and substrate 110 and the electrically insulating material layer 150 respectively without use of deposition inhibitor layers 500 or 501. For example, after substrate 110 including conductive material layers 120 and 130 (the gate material layer stack) with reentrant profile 170 has been provided, electrically insulating material layer 150 is deposited over a portion of the gate material layer stack and over a portion of the substrate. A patterned deposition inhibiting material 500 is then deposited over the electrically insulating material layer. A semiconductor material layer 160 is then deposited over the electrically insulating material layer using a selective area deposition process in which the semiconductor material layer is not deposited over the patterned deposition inhibiting material. Optionally, the electrically insulating material layer can be patterned prior to depositing the patterned deposition inhibiting material.

After removal of deposition inhibitor layer 500, if such is necessary, at least one of electrically conductive material layer 710 or electrically conductive material layer 810 are directionally deposited over semiconductor material layer 160.

In some example embodiments, the resist material layer 140 can be deposited over the second electrically conductive material layer 130 and patterned in the same process step. A liquid etchant can be used to remove the exposed portion of the second electrically conductive material layer 130 to expose a portion of the first electrically conductive material layer 120. The same liquid etchant that is used to remove the exposed portion of the second electrically conductive material layer 130 can be used to remove the exposed portion of the first electrically conductive material layer 120 to create the reentrant profile 170 in the electrically conductive material layer 120.

In some example embodiments, substrate 110 can include more than one material layer. The additional material layer(s) is included in some instances to improve or maintain the structural integrity of substrate 110 during the manufacturing process. When substrate 110 includes more than one material layer, for example, a first layer and a second layer, the fabrication method can include removing the second layer of substrate 110.

Referring back to FIGS. 2a and 2b, a schematic cross sectional view of transistor 100 material layers prior to material processing is shown. The manufacturing process for forming the vertical transistor device begins with a substrate 110 that is non-conductive, either in whole or in part with respect at least the portion of the substrate that is adjacent to conductive layer 120 (the top of the substrate 110 as shown in FIGS. 2a and 2b), such that electrical shorting of transistor 100 does not occur. Conductive layers 120 and 130 are applied to or deposited onto substrate 110. The combined conductive layers 120 and 130 function as the gate of transistor 100 and by the combined thickness of conductive layers 120 and 103 (in the vertical direction as shown in FIG. 2a) defines a length of the gate by the combined thickness. A resist layer 140 is applied to conductive layer 130. Resist 140 is patterned.

Substrate 110 does not interact appreciably with any of the layers or the processing methods. Substrate 110, often referred to as a support, can be used for supporting the thin film transistor (also referred to as a TFT) during manufacturing, testing, or use. Those skilled in the art will appreciate that a support selected for commercial embodiments can be different from one selected for testing or screening embodiments. In some embodiments, substrate 110 does not provide any necessary electrical function for the TFT. This type of substrate 110 is termed a "non-participating support" herein. Useful substrate materials include organic or inorganic materials. For example, substrate 110 can include inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP). The thickness of substrate 110 can vary, typically from about 100 µm to about 1 cm.

A flexible support or substrate 110 is used in some example embodiments of the present invention. Using a flexible substrate 110 allows for roll processing, which can be continuous, providing economy of scale and economy of manufacturing over flat or rigid supports. The flexible support chosen is preferably capable of wrapping around the circumference of a cylinder of less than about 50 cm in diameter, more preferably 25 cm in diameter, and most preferably 10 cm in diameter, without distorting or breaking, using low force as by unaided hands. The preferred flexible support can be rolled upon itself. Additional examples of flexible substrates include thin metal foils such as stainless steel provided the foils are coated with an insulating layer to electrically isolate the thin film transistor. If flexibility is not a concern, then the substrate can be a wafer or sheet made of materials including glass and silicon.

In some example embodiments, substrate 110 can include a temporary support or support layer, for example, when additional structural support is desired for a temporary purpose, e.g., manufacturing, transport, testing, or storage. In these example embodiments, substrate 110 can be detachably adhered or mechanically affixed to the temporary support. For example, a flexible polymeric support can be temporarily adhered to a rigid glass support to provide added structural rigidity during the transistor manufacturing process. The glass support can be remove from the flexible polymeric support after completion of the manufacturing process.

The conductive layers 120 and 130, commonly referred to as conductors, can be any suitable conductive material that permits conductive layers 120 and 130 to function as a gate. Conductive layers 120 and 130 can also be made of the same material. A variety of gate materials known in the art are also suitable, including metals, degenerately doped semiconductors, conducting polymers, and printable materials such as carbon ink, silver-epoxy, or sinterable metal nanoparticle suspensions. For example, the gate electrode can include doped silicon, or a metal, such as aluminum, chromium, gold, silver, nickel, copper, tungsten, palladium, platinum, tantalum, and titanium. Gate electrode materials can also include transparent conductors such as indium-tin oxide (ITO), ZnO, SnO2, or In2O3. Conductive polymers also can be used, for example polyaniline, poly(3,4-ethylenedioxythiophene)/poly(styrene sulfonate) (PEDOT:PSS). In addition, alloys, combinations, and multilayers of these materials can be used. In addition the materials for conductor 120 and conductor 130 are preferable different and are chosen to facilitate creation of reentrant profile 170.

The gate electrode can be deposited on substrate 110 using chemical vapor deposition, sputtering, evaporation, doping, or solution processing. In some embodiments of the invention, the same material can provide the gate electrode function and also provide the support function of substrate 110 provided substrate 110 also includes an insulating layer to electrically isolate transistor 100. For example, doped silicon or silicon on insulator (SOI) can function as the gate electrode and support the TFT.

The thickness (the vertical direction as shown in FIG. 2a) of the gate electrode can vary, typically from about 100 to about 10000 nm. As the thickness defines the gate length, the thickness is usually thicker than twice the thickness of the conformally coated materials in order to reduce the likelihood of electrical shorting.

Conductive layer 130 is coated with a resist 140. Resist 140 is patterned. Resist 140 can be a conventional photoresist known in the art such as a polymeric positive acting resist or a negative resist. Resist 140 is exposed through a mask with a low resolution (>1 mm) alignment to substrate 110 and developed to yield a pattern of resist. In another example embodiment, the pattern of resist 140 is accomplished using a printing process, such as flexography or inkjet printing, that prints the resist directly in a patterned manner without using a mask.

Referring back to FIGS. 3a-5b, a schematic cross sectional view and planar top view of transistor 100 material layers during and after material processing are shown. In FIGS. 3a and 3b, conductive layer 130, commonly referred to as a conductor, is etched through patterned resist 140. The etchant can be any organic or inorganic material which removes the nonconductive material without substantial attacking resist 140 or the underlying conductor layer 120. Conductor 120 is then removed using a suitable etchant which removes the conductor 120 but has little impact on substrate 110 or the overlying conductive layer 130. As such, the selected etchant often depends on the substrate 110, the conductor 120, or the conductor 130. Etchant interaction with resist 140 and loss of the resist 140 at this point is usually of little consequence, since the conductor 130 now acts as a mask. As shown in FIGS. 3a and 3b, the etching process or processes used, etch away portions of conductor 120 and conductor 130 such that conductor 120 and conductor 130 have the same pattern.

As shown in FIGS. 4a and 4b, selective etching of conductor 120 is continued until the reentrant profile 170 shown in FIGS. 4a and 4b is formed. When etching of conductor 120 is complete, conductor 130 overhangs conductor 120 which creates a reentrant profile 170 that is sufficient to shield at least some of the underlying surface (of either conductor 120 or substrate 110) from coating by a directional (or line-of-sight) coating source positioned above (as shown in FIGS. 9a and 9b) substrate 110. Alternatively stated, conductor 120 underhangs conductor 130. The remaining conductors 120 and 130 act as the gate conductor when the semiconductor device is complete.

At this point, if it is necessary, resist 140 is removed. Gentle cleaning can be performed on the material layer stack, if desired, provided that the cleaning process does not remove the reentrant profile 170. FIG. 5a shows a cross sectional view of the semiconductor device after the reentrant profile 170 has been created and after resist has been removed.

Referring back to FIGS. 6a-8b, schematic cross sectional views and planar top views of the semi-conductor device after printing of a deposition inhibitor material layer, and conformal coating of a dielectric nonconductive material, often referred to as an insulator, and a semiconductor material, respectively, are shown. In FIGS. 6a and 6b, a deposition inhibitor layer 500 is printed on portions of the substrate 110 and gate conductive layer 130. Printing of deposition layer 500 can be accomplished by various methods including an inkjet printing process, a flexographic printing process, a gravure printing process, and a photolithographic process. The deposition inhibitor layer 500 is used to provide selective area deposition (SAD) of subsequent material layers in producing transistor 100. SAD requires that designated areas of a surface be masked or "protected" to prevent reactions in those selected areas, thus ensuring that the desired layer nucleates and grows only on the desired unmasked regions. It is also possible to have SAD processes where the selected areas of the surface area are "activated" or surface modified in such a way that the film is deposited only on the activated areas. There are many potential advantages to selective area deposition techniques, such as eliminating an etch process for film patterning, reduction in the number of cleaning steps required, and patterning of materials which are difficult to etch. Two suitable approaches to combining patterning and depositing the semiconductor are described in US Patent Application Publication No. 2009/0081827 A1, published to Yang et al., on Mar. 26, 2009, the disclosure of which is hereby incorporated by reference in its entirety; and U.S. Pat. No. 8,017,183 B2, issued to Yang et al., on Sep. 13, 2011, the disclosure of which is hereby incorporated by reference in its entirety. Given that the preferred subsequent layers are deposited and conformally coated by atomic layer deposition (ALD), preferred deposition inhibitor materials are described in U.S. Pat. No. 7,998,878 B2, issued to Levy et al., on Aug. 16, 2011, the disclosure of which is hereby incorporated by reference in its entirety. In addition, deposition inhibitor materials are chosen to be compatible with printing on large flexible substrates in a low cost manner.

Referring again to FIGS. 6a and 6b, although deposition inhibitor layer 500 is shown as a rectangular annulus, it is noted that this is a view of a single transistor 100 and that a pattern of an array of adjacent transistors 100 can be created. This array of adjacent transistors 100 can be produced by printing patterns, for example, orthogonal lines, of deposition inhibitor material 500.

In FIGS. 7a and 7b, a dielectric nonconductive material 150 is then conformally coated only in regions that are not covered by deposition inhibitor layer 500, using a conformal coating deposition process over substrate 110 and the topographic feature formed by material layers 120 and 130. Applying nonconductive material 150 using a conformal coating process helps to maintain the reentrant profile 170. Nonconductive material 150 is often referred to as the gate dielectric. Suitable nonconductive materials include strontiates, tantalates, titanates, zirconates, aluminum oxides, silicon oxides, tantalum oxides, titanium oxides, silicon nitrides, barium titanate, barium strontium titanate, barium zirconate titanate. As the dielectric material separates the gate conductor from the semiconductor material that is to be applied, it is important that the conformally coated material be provided with a consistent or uniform thickness at least in the region where the reentrant profile 170 and the gate are located.

Preferred processes for accomplishing conformal coating include atomic layer deposition (ALD) or one of its derivatives such as spatial ALD (S-ALD) or plasma enhanced ALD (PEALD) because these processes yield a uniform thickness coating over or on a highly varying topology. ALD and S-ALD are discussed in more detail below.

In FIGS. 8a and 8b, a semiconductor material 160 is then conformally coated only in regions that are not covered by deposition inhibitor layer 500 (or layer 501), using a conformal coating deposition process which helps to maintain the reentrant profile 170. This conformal coating process can be the same process used previously to coat the dielectric material. Alternatively, the conformal coating process can be different. As the semiconductor material 160 acts as a channel between electrodes 700 and 800 when gate 120 and 130 is energized, it is important that the conformally coated material be provided with a consistent or uniform thickness at least in the region where the reentrant profile 170 and the gate are located and more preferable in the areas between electrode(s) 700 and electrode 800 including the area where the reentrant profile 170 and the gate are located. A preferred process for conformally coating is atomic layer deposition (ALD) or one of its various derivatives such as spatial ALD (S-ALD). This process yields a uniform thickness on a highly varying topology. ALD and S-ALD are discussed in more detail below.

The semiconductor material layer 160, often referred to as a semiconductor, can be any type of semiconductor provided the semiconductor material can be deposited or coated using a conformal coating process such as ALD. Examples of suitable semiconductor materials include zinc oxide, zinc chalcogenides, cadmium chalcogenides, gallium pnictides, aluminum nictides, or silicon.

The semiconductor can optionally be doped with other materials to increase or decrease the conductivity. In some example embodiments, a depletion mode device is desirable, and therefore carriers can be added through the use of dopants. When the semiconductor is a zinc oxide, the use of an aluminum dopant, for example, increases the electron carrier density. In this configuration, the gate is typically used to turn off the device by making it negative relative to the drain and source.

A compensating dopant can also be used to deplete the intrinsic carrier density. When the semiconductor is zinc oxide, the use of nitrogen has been found to decrease the electron carrier density making it less n-type. In this configuration, the semiconductor can be made to operate in an accumulation mode to turn on the transistor when a positive gate voltage is applied. These dopants are often added as compounds during the growth process but can also be added after the semiconductor layer has been applied using a process such as ion implantation and thermal diffusion.

Referring back to FIGS. 9a and 9b, a schematic cross sectional view and planar top view of the transistor 100 during directional coating of an electrically conductive material is shown. After semiconductor layer 160 has been deposited, and deposition inhibitor layer is removed (if such is necessary), the source and drain electrode(s) 700 and electrode 800 are deposited using a directional (or line-of-sight) deposition process which does not deposit or coat material into the reentrant profile 170, or in areas blocked by shadow mask 900. Examples of suitable directional deposition processes include thermal evaporation, electron beam evaporation, sputtering, or laser ablation. The active channel gap between electrode(s) 700 and electrode 800 is maintained by the shadow casted by the overhang of conductive layer 130 relative to conductive material layer 120.

Figure 10B:
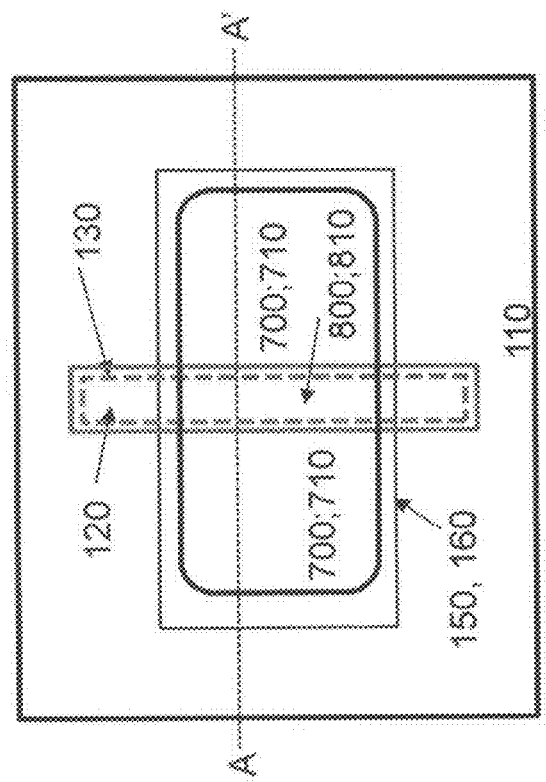
Figure 10A:
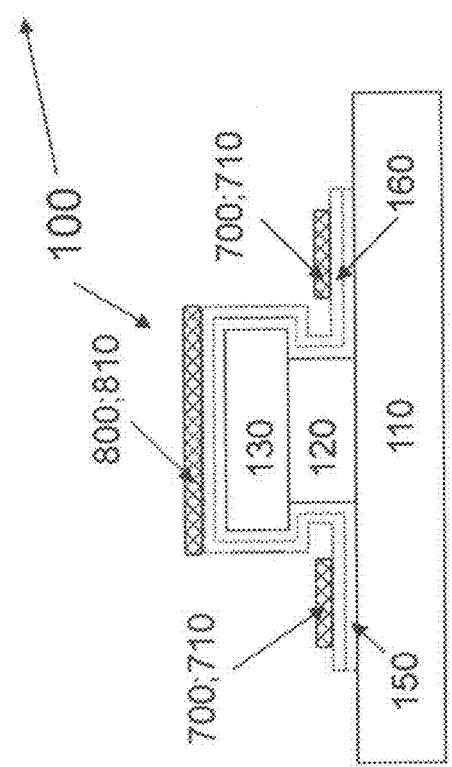

Referring back to FIGS. 10a and 10b, transistor 100 after electrode(s) 700 and electrode 800 have been deposited is shown. The drain and the source of transistor 100 can be selected from either of electrode 700 and electrode 800 with the selection typically being based on the application and the characteristics of the contemplated device. As shown in FIGS. 10a and 10b, electrode 800 is on the top of the mesa formed by conductor 130 and conductor 120 while electrode (s) 700 is not. As such, electrode 700 and electrode 800 are on different planes. Any necessary interconnects can be accomplished using conventional techniques, for example, layer leveling and via feed through, well known in the art.

Substrate 110, conductive layer 120, conductive layer 130, nonconductive layer 150, semiconductor layer 160, or combinations thereof can include one or more layers provided the functional aspect of the layer remains unchanged. Additional layers, for example, leveling layers, barrier layers, adhesion layer, can be included in the semiconductor device as long as the function of the layers described above is preserved.

Atomic Layer Deposition (ALD) is a process which is used to produce coatings with thicknesses that can be considered consistent, uniform, or even exact. ALD produces coatings that can be considered conformal or even highly conformal material layers. Generally described, an ALD process accomplishes substrate coating by alternating between two or more reactive materials, commonly referred to a precursors, in a vacuum chamber. A first precursor is applied to react with the substrate. The excess of the first precursor is removed is removed from the vacuum chamber. A second precursor is then applied to react with the substrate. The excess of the second precursor is removed from the vacuum chamber and the process is repeated.

Recently, a new ALD process has been developed which negates the need for a vacuum chamber. This process, commonly referred to as S-ALD, is described in at least one of U.S. Pat. Nos. 7,413,982, 7,456,429, US 2008/0166884, and US 2009/0130858, the disclosures of which are incorporated by reference in their entirety herein. S-ALD produces coatings with thicknesses that can be considered consistent, uniform, or even exact. S-ALD produces coatings that can be considered conformal or even highly conformal material layers. S-ALD is compatible with a low temperature coating environment and provides the ability to use higher mobility materials when compared to other coating techniques. Additionally, S-ALD is compatible with web coating, making it attractive for large scale production operations. Even though some web coating operations may experience alignment issues, for example, web tracking or stretching issues, the architecture of the present invention reduces reliance on high resolution or very fine alignment features during the manufacturing process. As such, S-ALD is well suited for manufacturing the present invention.

The invention has been described in detail with particular reference to certain preferred embodiments thereof, but it will be understood that variations and modifications can be effected within the scope of the invention.

PARTS LIST 100 transistor
110 substrate
120 electrically conductive material layer
130 electrically conductive material layer
140 photoresist
150 gate dielectric
160 semiconductor
170 reentrant profile
500 deposition inhibitor layer
501 second deposition inhibitor layer
700 electrode
710 electrically conductive material layer
800 electrode
810 electrically conductive material layer
900 shadow mask

The invention claimed is:

1. A method of producing a vertical transistor comprising:
providing a substrate including a gate material layer stack with a reentrant profile;
providing a patterned deposition inhibiting material over a portion of the gate material layer stack and over a portion of the substrate;
depositing an electrically insulating material layer over a portion of the gate material layer stack and over a portion of the substrate using a selective area deposition process in which the electrically insulating material layer is not deposited over the patterned deposition inhibiting material; and
depositing a semiconductor material layer over the electrically insulating material layer.

2. The method of claim 1, wherein depositing the semiconductor material layer over the electrically insulating material layer includes depositing the semiconductor material layer over the electrically insulating material layer using a selective area deposition process in which the semiconductor material layer is not deposited over the patterned deposition inhibiting material.

3. The method of claim 1, wherein providing the patterned deposition inhibiting material includes using one of an inkjet printing process, a flexographic printing process, a gravure printing process, and a photolithographic process.

4. The method of claim 1, further comprising:
depositing a source/drain material layer over discrete locations of the semiconductor material layer.

* * * * *